(12) United States Patent
Korneisel et al.

(10) Patent No.: US 11,613,802 B2
(45) Date of Patent: Mar. 28, 2023

(54) ADDITIVELY MANUFACTURED SHADOW MASKS FOR MATERIAL DEPOSITION CONTROL

(71) Applicant: Rockwell Collins, Inc., Cedar Rapids, IA (US)

(72) Inventors: Richard Korneisel, Cedar Rapids, IA (US); Nathaniel P. Wyckoff, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/232,583

(22) Filed: Apr. 16, 2021

(65) Prior Publication Data

US 2021/0324508 A1 Oct. 21, 2021

Related U.S. Application Data

(60) Provisional application No. 63/011,825, filed on Apr. 17, 2020.

(51) Int. Cl.
| | | |
|---|---|---|
| *C23C 14/04* | (2006.01) | |
| *C23C 16/04* | (2006.01) | |
| *H01L 51/00* | (2006.01) | |
| *B33Y 80/00* | (2015.01) | |

(52) U.S. Cl.
CPC .......... *C23C 14/042* (2013.01); *C23C 16/042* (2013.01); *H01L 51/0011* (2013.01); *B33Y 80/00* (2014.12)

(58) Field of Classification Search
None
See application file for complete search history.

(56) References Cited

U.S. PATENT DOCUMENTS

| | | | |
|---|---|---|---|
| 6,475,287 B1 * | 11/2002 | Clark | C23C 14/042 118/721 |
| 6,589,382 B2 * | 7/2003 | Clark | C23C 14/042 118/721 |
| 6,749,690 B2 * | 6/2004 | Clark | H01L 21/682 118/721 |
| 6,890,385 B2 * | 5/2005 | Tsuchiya | C23C 14/042 118/721 |
| 7,695,596 B2 * | 4/2010 | Kang | C23C 14/042 204/192.12 |

(Continued)

FOREIGN PATENT DOCUMENTS

EP         1707648 B1    9/2009

*Primary Examiner* — Jethro M. Pence
(74) *Attorney, Agent, or Firm* — Suiter Swantz pc llo

(57) ABSTRACT

A shadow mask for a substrate is disclosed. The shadow mask includes a frame circumscribing a surface of the substrate. The shadow mask further includes one or more island mask features within the surface of the substrate, configured to block a deposition of a material onto at least a portion of the surface of the substrate. The shadow mask further includes one or more crossbeams coupling one or more island mask features to the frame at an elevation relative to the substrate. The one or more cross beams are configured to permit deposition of a material onto the substrate surface underneath the one or more crossbeams. In some instances, the shadow mask is manufactured through an additive manufacturing process.

14 Claims, 6 Drawing Sheets

(56) References Cited

U.S. PATENT DOCUMENTS

| | | | | |
|---|---|---|---|---|
| 8,343,278 B2* | 1/2013 | Sung | | C23C 14/042 118/721 |
| 8,459,526 B2* | 6/2013 | Hong | | C23C 14/042 228/49.4 |
| 8,631,761 B2* | 1/2014 | Kang | | C23C 14/042 118/721 |
| 8,646,406 B2* | 2/2014 | Ahn | | H01L 51/0011 118/301 |
| 8,808,402 B2* | 8/2014 | Krijne | | C23C 14/042 438/944 |
| 8,881,677 B2* | 11/2014 | De | | B05C 21/005 118/504 |
| 8,904,954 B2* | 12/2014 | Bruce | | B05B 12/26 427/259 |
| 8,993,398 B1 | 3/2015 | Sutardja et al. | | |
| 9,579,680 B2* | 2/2017 | Gephart | | B41F 17/006 |
| 9,780,305 B2* | 10/2017 | Kwen | | H01L 51/0011 |
| 10,084,133 B2* | 9/2018 | Chen | | B05C 21/005 |
| 10,090,467 B2 | 10/2018 | Kawato et al. | | |
| 10,141,511 B2* | 11/2018 | Kim | | H01L 27/3244 |
| 10,186,662 B2* | 1/2019 | Kim | | H01L 51/56 |
| 10,196,737 B2* | 2/2019 | Inoue | | C23C 14/54 |
| 10,570,499 B2* | 2/2020 | Lin | | C23C 14/042 |
| 10,663,857 B2* | 5/2020 | Lv | | C23C 14/12 |
| 10,818,877 B2* | 10/2020 | Hong | | H01L 27/326 |
| 10,829,847 B2* | 11/2020 | Zhang | | C23C 14/042 |
| 10,982,314 B2* | 4/2021 | Lin | | B05D 1/32 |
| 11,091,829 B2* | 8/2021 | Zhang | | C23C 14/042 |
| 2003/0108805 A1* | 6/2003 | Clark | | H01L 51/0011 430/22 |
| 2004/0020435 A1* | 2/2004 | Tsuchiya | | C23C 14/042 118/723 VE |
| 2012/0279444 A1* | 11/2012 | Hong | | C23C 14/042 118/504 |
| 2013/0137334 A1* | 5/2013 | Ishikawa | | C23C 14/5886 118/504 |
| 2014/0137798 A1* | 5/2014 | Ahn | | B05C 21/005 118/504 |
| 2015/0101536 A1* | 4/2015 | Han | | C23C 14/042 118/721 |
| 2015/0165464 A1* | 6/2015 | Baek | | C23C 14/042 118/504 |
| 2016/0005970 A1* | 1/2016 | Kwen | | C23C 16/042 118/504 |
| 2016/0079568 A1* | 3/2016 | Han | | C23C 18/31 438/34 |
| 2016/0311161 A1 | 10/2016 | Lane | | |
| 2017/0222145 A1* | 8/2017 | Kim | | B05C 21/005 |
| 2017/0273196 A1* | 9/2017 | Ehrenberg | | C23C 14/20 |
| 2019/0044070 A1 | 2/2019 | Nishida et al. | | |
| 2019/0144987 A1* | 5/2019 | Guo | | H01L 51/56 118/504 |
| 2019/0368028 A1 | 12/2019 | Yamabuchi et al. | | |
| 2019/0377255 A1 | 12/2019 | Lin et al. | | |
| 2020/0071813 A1* | 3/2020 | Kim | | C23C 14/042 |
| 2020/0199733 A1* | 6/2020 | Uchida | | H01L 51/56 |
| 2020/0216944 A1* | 7/2020 | Chun | | B05B 12/20 |
| 2020/0232091 A1* | 7/2020 | Ahn | | C23C 16/042 |
| 2020/0238328 A1* | 7/2020 | Lee | | H01L 27/3244 |
| 2020/0239998 A1* | 7/2020 | Zhao | | C23C 14/042 |
| 2021/0039378 A1* | 2/2021 | Ehrenberg | | C23C 14/20 |
| 2021/0210735 A1* | 7/2021 | Kang | | H01L 51/56 |
| 2021/0305542 A1* | 9/2021 | Kim | | H01L 51/0011 |
| 2021/0367151 A1* | 11/2021 | Deng | | C23C 14/044 |
| 2021/0404079 A1* | 12/2021 | Xiao | | B05C 17/06 |
| 2022/0121115 A1* | 4/2022 | Oka | | C21D 6/007 |

* cited by examiner

ADDITIVELY MANUFACTURED SHADOW MASKS FOR MATERIAL DEPOSITION CONTROL

PRIORITY

The present application claims the benefit under 35 U.S.C. § 119(e) of U.S. Provisional App. No. 63/011,825 (filed Apr. 17, 2020), which is incorporated herein by reference in its entirety.

BACKGROUND

Shadow masks, also referred to as deposition masks, are used with material deposition processes to selectively deposit material with complex geometries onto electronic substrates as an alternative to photolithography, an expensive, difficult, and chemically limited process. However, a traditionally manufactured shadow mask is limited since it must be a singular solid member. Therefore, 'island' type masking is problematic and limits design capabilities. Thus, it is desirable to provide a system that avoids the shortcomings of conventional approaches.

SUMMARY

A shadow mask for a substrate is disclosed. In some embodiments, the shadow mask includes a frame circumscribing a surface of the substrate. In some embodiments, the shadow mask further includes one or more island mask features within the surface of the substrate, configured to block a deposition of a material onto at least a portion of the surface of the substrate. In some embodiments, the shadow mask further includes one or more crossbeams coupling one or more island mask features to the frame at an elevation relative to the substrate. In some embodiments, the one or more cross beams are configured to permit deposition of a material onto the substrate surface underneath the one or more crossbeams.

In some embodiments of the shadow mask, the shadow mask is manufactured through an additive manufacturing process.

In some embodiments of the shadow mask, one or more cross beams are further configured to couple two or more island mask features.

In some embodiments of the shadow mask, the shadow mask further comprises one or more posts coupled at a first end to at least one of the one or more island mask features or the frame and coupled at a second end to one of the one or more crossbeams. In some embodiments, one or more posts are configured to elevate the one of the one or more crossbeams relative to the surface of the substrate.

In some embodiments of the shadow mask, the deposition of the material upon the surface of the substrate is configured as a physical vapor deposition or sputtered deposition.

In some embodiments of the shadow mask, the substrate is configured as an electronic device.

In some embodiments of the shadow mask, the deposition of the material upon the surface of the substrate is configured as a chemical vapor deposition or photolithography.

In some embodiments of the shadow mask, the surface of the substrate further comprises one or more surface portions of differing elevation, wherein the one or more mask island features are further configured to mask the one or more surface portions of differing elevation.

In some embodiments of the shadow mask, the surface of the substrate is further configured as a nonplanar surface, wherein the frame is further configured to conform to the nonplanar surface.

In some embodiments of the shadow mask, the one or more island mask features are further configured to block the deposition of the material to at least a portion of the nonplanar surface.

In some embodiments of the shadow mask, the shadow mask further comprises non-island mask features. In some embodiments of the shadow mask, the non-island mask features are etched or cut through a mask layer configured to block a portion of the surface of the substrate Another shadow mask for a substrate is disclosed. In some embodiments, the shadow mask includes a frame circumscribing a surface of the substrate. In some embodiments, the shadow mask includes one or more mask features coupled to the frame configured to block a deposition of a material onto at least a portion of the surface, wherein the shadow mask is manufactured through an additive manufacturing process.

In some embodiments of the shadow mask, the shadow mask further includes one or more crossbeams coupling the one or more mask features to the frame at an elevation relative to the substrate, wherein the one or more crossbeams are configured to permit the deposition of the material onto the surface of the substrate underneath the one or more crossbeams.

In some embodiments of the shadow mask, at least one of the one or more mask features is further configured as an island mask feature.

In some embodiments of the shadow mask, one or more cross beams are further configured to couple two or more island mask features.

In some embodiments of the shadow mask, the shadow mask further comprises one or more posts coupled at a first end to at least one of the one or more island mask features or the frame and coupled at a second end to one of the one or more crossbeams. In some embodiments, one or more posts are configured to elevate the one of the one or more crossbeams relative to the surface of the substrate.

In some embodiments of the shadow mask, the deposition of the material upon the surface of the substrate is configured as a physical vapor deposition or sputtered deposition.

In some embodiments of the shadow mask, the substrate is configured as an electronic device.

In some embodiments of the shadow mask, the deposition of the material upon the surface of the substrate is configured as a chemical vapor deposition or photolithography.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
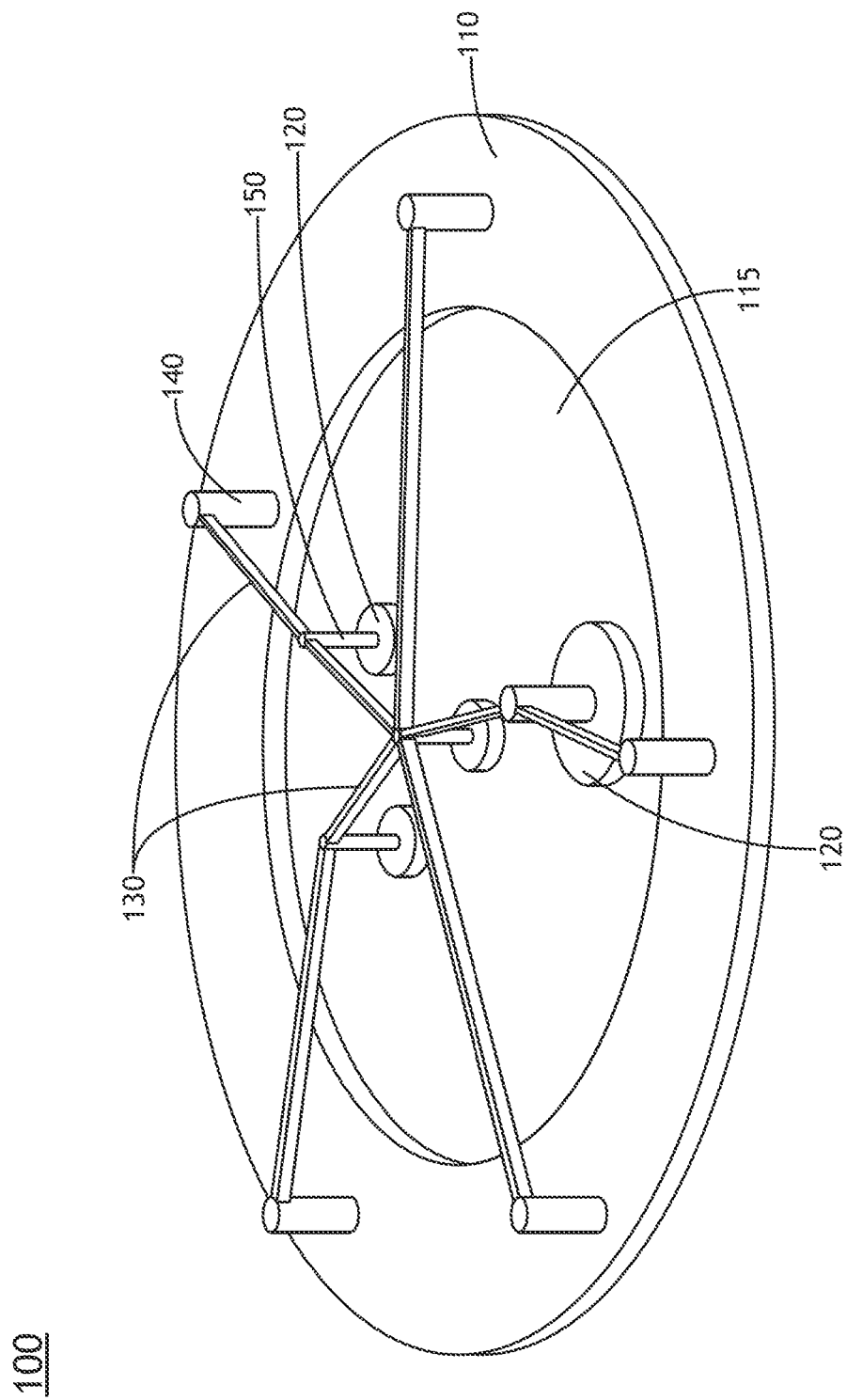
FIG. 1 is a diagram illustrating a perspective view of a shadow mask in accordance with one or more embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only and should not be construed to limit the disclosure in any way unless expressly stated to the contrary. Further, for the sake of clarity, where multiple similar features appear on a figure, the numbering of one feature may be intended to represent the numbering of a similar but unlabeled feature.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

Broadly, embodiments of the concepts disclosed herein are directed to a shadow mask for use in material deposition processes. The traditional approaches for material deposition (e.g., physical vapor deposition (PVD) or sputtering) on a substrate require the use of shadow masked (e.g., deposition masks) to control which areas of the substrate do not receive a layer of material. Shadow masks are particularly useful for depositing material with complex geometries onto electronic substrates, and is a less expensive and less difficult alternative to photolithography.

One constraint of using shadow masks is the inability of the mask to produce an island (e.g., a secluded area of masking surrounded by deposed material). The use of suicide layers (e.g., removal of deposed material to create an island) is a tedious and expensive process. In embodiments of this disclosure, island-producing shadow masks are created by placing island features within a shadow mask frame, and connecting the island features to the frame with crossbeams that are raised, allowing space between the crossbeam and the substrate below. Because deposition materials are often applied in a rotating fashion (e.g., with either the substrate or the deposing element being rotated) the surface of the substrate below the crossbeam is coated along with other unmasked parts of the substrate. The shadow mask thus can produce considerably more complex mask structures than a traditional shadow mask. The shadow mask can also be produced through additive manufacturing methods (e.g., 3D printing), further expanding the potential applications of the shadow mask.

FIG. 1 is a diagram illustrating a perspective view of a shadow mask 100 in accordance with one or more embodiments of this disclosure. In some embodiments, the shadow mask 100 includes a frame 110. The frame 110 circumscribes a surface 115 (e.g., of a surface of a substrate surrounded by the frame 110). In some embodiments, the frame 110 sits on top of the substrate. The frame 110 may be made from any material known in the art including but not limited to plastic metal and ceramic. The frame 110 may take any shape known the in the art. For example, the shape may be any polygon known the art including but not limited to a quadrilateral, a circle (e.g., as in FIG. 1) or a hexagon. The frame 110 may also be a convex or concave shape. The frame 110 may also have a complex and/or asymmetrical shape. For example, the frame 110 may have the shape of the continent of Africa. In some embodiments, the frame 110 may not entirely circumscribe the surface 115. For example, the frame 110 may be an open circle.

The substrate or the surface 115 of the substrate may be any substrate in the art configured for disposition. For example, the substrate may be an electronic device. For instance, the substrate may be a computer chip. In another instance, the substrate may be a printed circuit board. In another example, the substrate may be a wing component of an aircraft. In another example, the substrate may be a mural for a building.

The frame 110 may be of any size known in the art for use in deposition processes. For example, the frame 110 may be a 100 mm×100 mm square for use in masking a computer chip. In another example, the frame 110 may be a 10 cm×10 cm frame for use in masking a printed circuit board. In another example, the frame 110 may be a 2 m×2 m frame for use in large scale PVD. For instance, the 2 m×2 m frame 110 may be used in masking a mural for a building.

In some embodiments, the shadow mask 100 further includes an island mask feature 120. The island mask feature masks (e.g., blocks) the deposition of a material so that when the shadow mask is removed, an island, or space, is created where no material has been deposited. The island mask feature 120 may be of any shape known in the art including but not limited to a square, an ovoid shape, or a wavy line. For example, the island mask feature 120 may be a circle (e.g., as in FIG. 1). The shape of the island mask feature 120 may be a convex shape or a concave shape. The size of the island mask feature 120 may be any size of island that fits within the frame 110. The number of island mask features 120 within the frame 110 or the shadow mask 100 may be any number known to the art. For example, the shadow mask 100 may have one island mask feature 120. In another example, the shadow mask may have four island mask features 120 (e.g., as in FIG. 4). In another example, the shadow mask 100 may have 3000 island mask features 120.

In some embodiments, the shadow mask 100 further includes one or more crossbeams 130. The one or more crossbeams 130 connect the island mask feature 120 to the frame, allowing the island mask feature 120 to be placed upon the surface 115, allowing the island mask feature 120 to act as a mask while connected to the frame 110. The crossbeam 130 may also connect between two or more island mask features 120. In this manner, a web of crossbeams 130 may be formed, creating a stable set of island mask features 120 within the shadow mask 100.

The crossbeams 130 are configured so that the deposition process is allowed to deposit material underneath the crossbeams onto the surface of the surface 115 below (e.g., by the concerted movement of the shadow mask 100 with the depositing element). For example, in some embodiments, the crossbeam is laid on top of, or connected near the top of, the frame and or the island mask feature 120, where the thickness of the mask and/or the island mask feature 120 is such that material may be deposited on the surface 115 below the crossbeam 130. In another example, the crossbeam is arched, allowing the disposition of material onto the surface 115 underneath the crossbeam.

In some embodiments, the shadow mask 100 further includes a frame post 140 and/or an island mask feature post 150 that are coupled to one or more crossbeams 130, the frame post 140 and island mask feature post 150 giving enough height to the crossbeam 130 that material may be deposited to the surface 115 below the cross beam. For example, both the frame 110 and one or more island mask feature 120 are configured with a frame post 140 and one or more island mask feature posts 150, respectively that are coupled to a crossbeam 130. In another example, the shadow mask 100 may be configured to only have frame posts 140 (e.g., the crossbeam 130 is coupled directly to the frame post 140 and the island mask feature 120. In another example, the shadow mask 100 may be configured to only have island mask feature posts 150 (e.g., the crossbeam 130 is coupled directly to the frame 110 and the one or more island mask feature posts 150.

In some embodiments the shadow mask 100 may further include non-island masked features. For example, the shadow mask may have a feature coupled to the frame 110 that masks portion of the surface 115. For instance, a portion of the feature coupled to the frame may have a section of the feature been removed (e.g., etched or cut away), similar to a traditional shadow mask. Thus, the shadow mask 100 may include both aspects of a traditional shadow mask and the island mask features 120 of the present disclosure. The shadow mask 100 may contain any combination of the island mask features 120 with other shadow mask technologies. Therefore, the above description should not be interpreted as a limitation of the present disclosure, but merely an illustration.

In some embodiments, the shadow mask 100 is produced in whole or in part by an additive manufacturing process (e.g., 3D printing). For example, in some embodiments, the additively manufactured shadow mask may include a frame 110 and a mask feature (e.g., an island mask feature 120 or a non-island mask feature). For instance, the frame and the mask feature may both be additively manufactured. In another instance, the island mask feature 120 is additively manufactured onto a preexisting frame. In another instance, the non-island mask feature (a masking feature with slits and/or apertures that determine which areas within the surface 115 are not masked), is additively manufactured into a preexisting frame. In another example, the shadow mask 100 may include crossbeams 130 and/or island mask posts 150 and/or frame posts 140 island that are additively manufactured into premanufactured frames and/or island masks.

The type of additive manufacturing process used to produce the shadow mask 100 may be any additive manufacturing process used in the art. For example, the additive manufacturing process may include a selective laser melting process. For instance, the selective laser melting process may be used to deposit metal onto a frame 110, forming a frame post 140. In another example, the additive manufacturing process may include a binder jetting technology. For instance, binder jetting technology may be utilized to produce the entire shadow mask out of a ceramic material. Many possible combinations of additive manufacturing technologies may be used to form portions of the shadow mask out of a variety of materials. Therefore, the above description should not be interpreted as a limitation of the present disclosure, but merely as an illustration.

In some embodiments, the shadow mask 100 is used in at least one of physical vapor deposition or sputtering. For example, the shadow mask 100 may be used in a cathodic arc deposition process. For instance, the shadow mask 100 may be used to mask a surface 115 from cathodic arc deposition of a metal material. In another example, the shadow mask be used in an evaporative deposition process. In some embodiments, the shadow mask may be used in at least one of chemical vapor deposition or photolithography. For example, the shadow mask may be used in a low-energy plasma-enhanced chemical vapor deposition.

Figure 2:
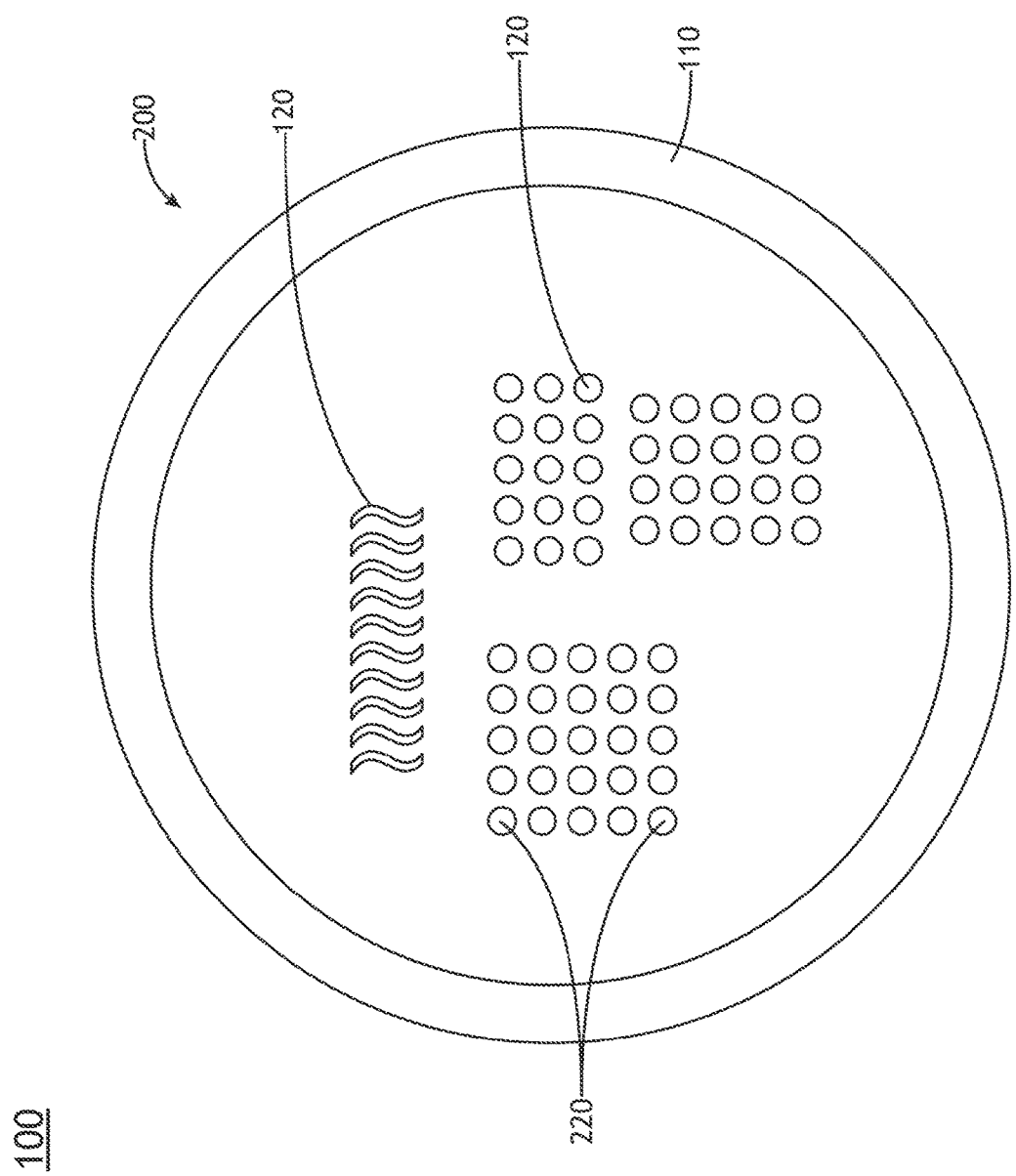
FIG. 2 is a diagram illustrating a plan view of a shadow mask placed upon a substrate, in accordance with one or more embodiments of this disclosure.

FIG. 2 is a plan view of a shadow mask 100 placed upon a substrate 200 (not shown for clarity), with the crossbeams 130 omitted in accordance with one or more embodiments of this disclosure. The substrate 200 may be any substrate known in the art that undergo material disposition. For example, in some embodiments, the substrate is an electronic device. For instance, the substrate may be a computer chip or a printed circuit board. In some embodiments, the substrate is a metal part for an aircraft (e.g., a housing section to an engine compartment).

The shadow mask 100 may include island mask features 120 in the shape of a circle and wavy lines. In some embodiments, the island mask features 120 may be arranged in an array 220. Alternatively, the island mask features may be arranged in a non-array configuration. It should be known that any arrangement and type of island mask features 120 may be used for the shadow mask 100. Therefore, the above description should not be interpreted as a limitation of the present disclosure, but merely as an illustration.

Figure 3:
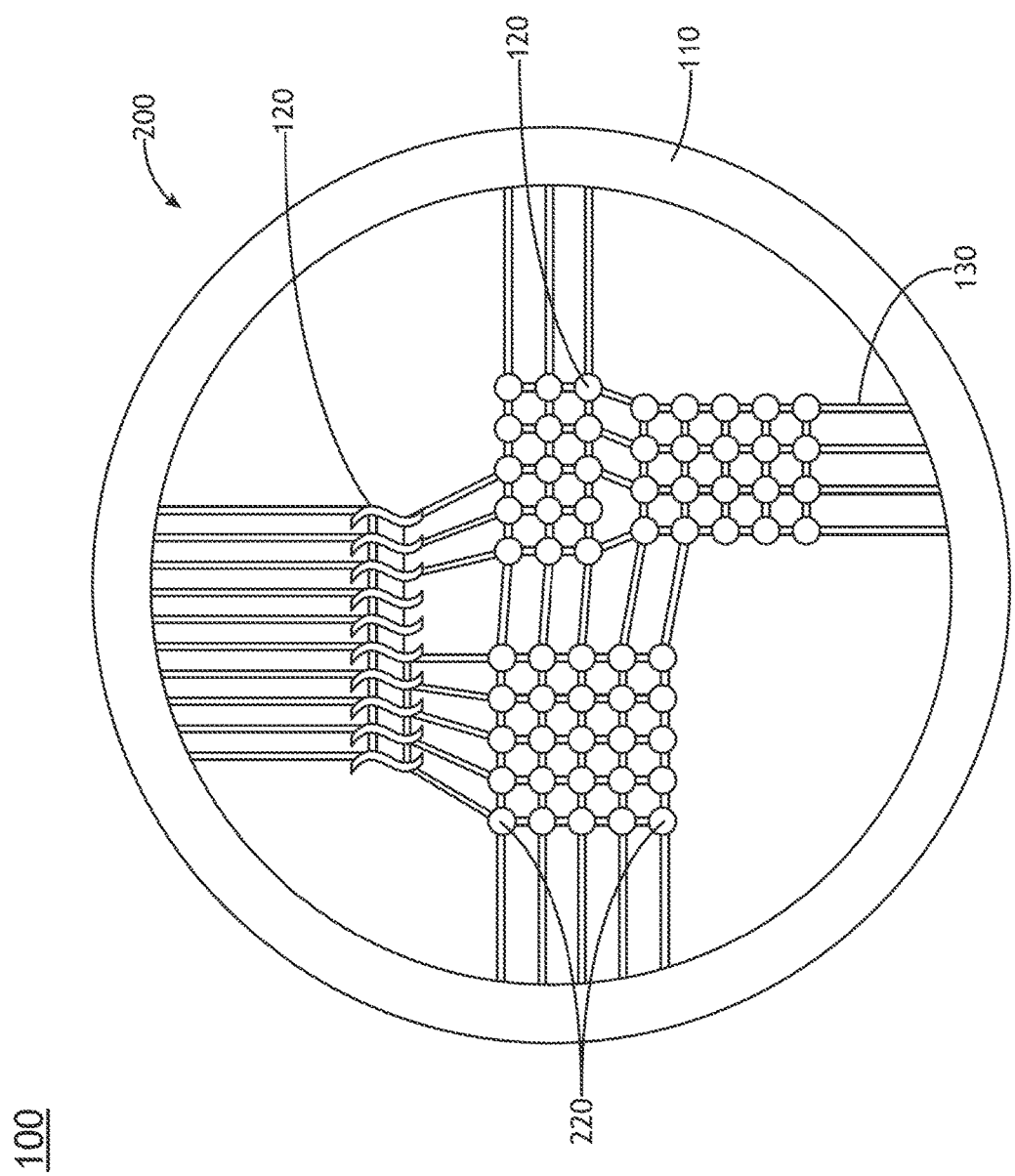
FIG. 3 is a diagram illustrating a plan view of a shadow mask placed upon a substrate with crossbeams, in accordance with one or more embodiments of this disclosure.

FIG. 3 is a plan view of a shadow mask 100 placed upon a substrate 200 (not shown for clarity), with the crossbeams 130 included in accordance with one or more embodiments of this disclosure. The crossbeams 130 attach some island mask features 120 to the frame 110 as well as attaching some island mask features 120 to other island mask features 120, creating a stabile web of island mask features 120.

Figure 4:
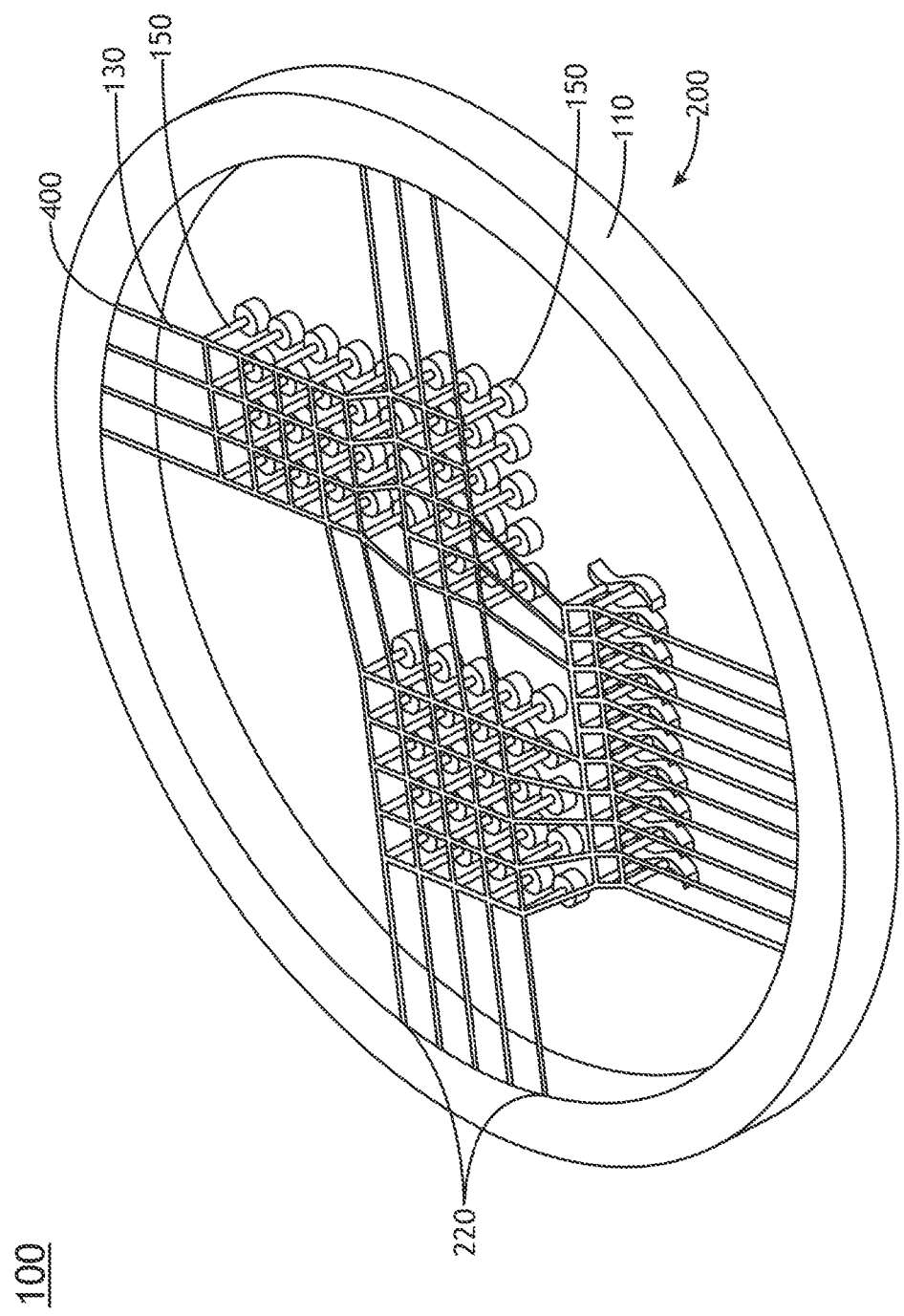
FIG. 4 is a diagram illustrating a perspective view of a shadow mask placed upon a substrate, in accordance with one or more embodiments of this disclosure.

FIG. 4 is a perspective view of a shadow mask 100 placed upon a substrate 200 (not shown for clarity) in accordance with one or more embodiments of this disclosure. The island mask features 120 are each coupled to island mask feature posts 150, which are then coupled to crossbeams 130. A portion of the crossbeams 130 are attached directly to the frame 110 at a crossbeam frame junction 400 (e.g., without a frame post). As noted herein, the shadow mask 100 may include or may not include a frame post 140 and may include or not include an island mask feature post 150. Therefore, the above description should not be interpreted as a limitation of the present disclosure, but merely as an illustration.

It should be noted that an island mask feature 120 may include more than one island mask feature post 150 or crossbeam 130 (e.g., such as the wavy line-shaped island mask feature in FIG. 4). It should also be noted that a single crossbeam may couple more than two island mask features 120. Therefore, the above description should not be interpreted as a limitation of the present disclosure, but merely as an illustration.

Figure 5:
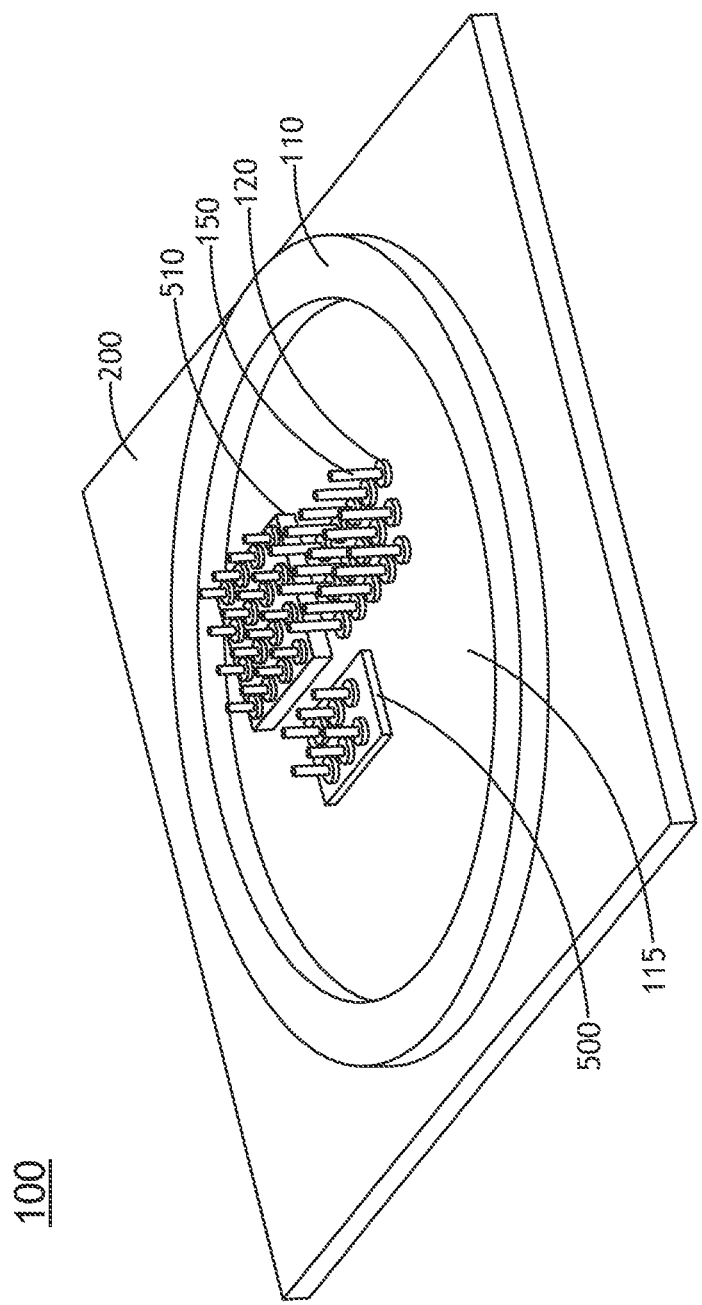
FIG. 5 is a diagram illustrating a perspective view of a shadow mask placed upon a substrate with crossbeams removed, wherein one or more surface portions of the substrate is comprised of differing elevations, in accordance with one or more embodiments of this disclosure.

FIG. 5 is a perspective view of a shadow mask 100 placed upon a substrate 200 without crossbeams 130 wherein one or more surface portions 500 of the surface 115 of the substrate is comprised of differing elevations, in accordance with one or more embodiments of this disclosure. Traditional deposition process involving shadow masks require the substrate 200 to be flat or near flat. In the current disclosure, the shadow mask may be configured to mask surfaces with different elevations, such as printed circuit boards previously coupled to bulky electronic components. For example, some island mask features 120 may be placed upon a medium elevation portion 500 of the surface 115. In another example, some island features 120 may be placed upon a high elevation portion 510 of the surface 115. Many combinations of elevated portions 500, 510 are possible. Therefore, the above description should not be interpreted as a limitation of the present disclosure, but merely as an illustration.

Figure 6:
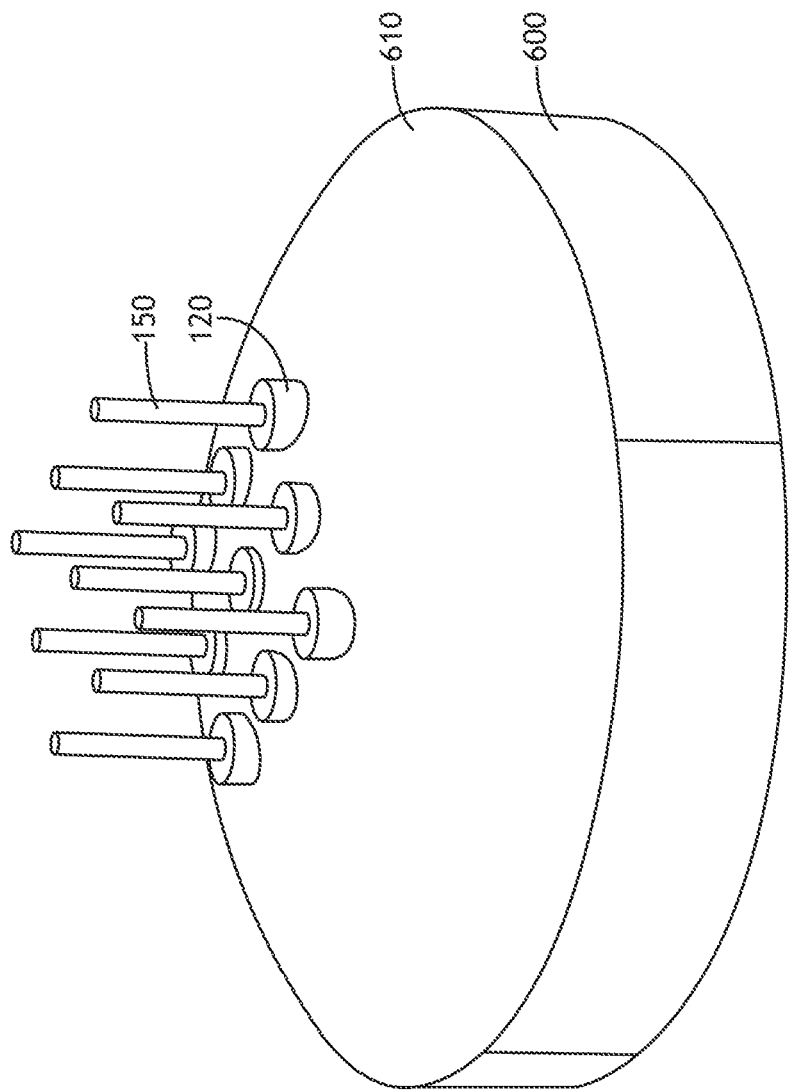
FIG. 6 is a diagram illustrating a perspective view of an array of island mask features placed upon a round substrate with a domed surface, with the frame and crossbeams removed, in in accordance with one or more embodiments of this disclosure.

FIG. 6 is a perspective view of an array 220 of island mask features 120 placed upon a round substrate 600 with a domed surface 610, with the frame 110 and crossbeams 130 removed, in accordance with one or more embodiments of this disclosure. The dome surface 610 is a nonplanar surface that cannot be masked by traditional shadow masks. In this disclosure, the island mask features 120 may be individually contoured to match the surface to be masked. Each custom-shaped island masked feature 120 is then coupled to an island masked feature post 150. One or more crossbeams would then be attached to the island masked feature posts 150, with some of the crossbeams attached to either a frame post 140 or the frame 110. For nonplanar substrates, the frame 110 may be configured to conform to the nonplanar surface. For example, the frame 110 may be configured to conform to the dome surface 610. In another example, the frame 110 may be configured to confirm to a highly irregular surface of a printed circuit boards previously coupled to bulky electronic components. Because the frame may be additively manufactured (e.g., 3D printed), any shape of the frame 110 may be manufactured to conform to the substrate 200. Therefore, the above description should not be interpreted as a limitation of the present disclosure, but merely an illustration.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. An assembly, comprising:
   a substrate comprising a surface;
   a shadow mask for the substrate, the shadow mask comprising:
     a frame circumscribing the surface of the substrate;
     a plurality of island mask features, wherein the plurality of island mask figures are configured as an island upon the surface of the substrate, wherein the plurality of island mask features are configured to block a deposition of a material onto at least a portion of the surface of the substrate;
     a plurality of crossbeams coupling the plurality of island mask features to the frame at an elevation relative to the substrate, wherein the plurality of crossbeams are configured to permit the deposition of the material onto the surface of the substrate underneath the plurality of crossbeams; and
     a first plurality of posts, wherein the first plurality of posts comprise a first end coupled to the plurality of island mask features, wherein the first plurality of posts comprise a second end coupled to the plurality of crossbeams, wherein the first plurality of posts elevate the plurality of crossbeams relative to the plurality of island mask features and relative to the surface of the substrate.

2. The assembly of claim 1, wherein the shadow mask is manufactured through an additive manufacturing process.

3. The assembly of claim 1, wherein the plurality of crossbeams are coupled between the plurality of island mask features.

4. The assembly of claim 1, the shadow mask comprising one or more posts coupled at a first end to at least one of the plurality of island mask features or the frame and coupled at a second end to one of the plurality of crossbeams, wherein the one or more posts elevate the one of the plurality of crossbeams relative to the surface of the substrate.

5. The assembly of claim 1, wherein the deposition of the material upon the surface of the substrate is configured as a physical vapor deposition or sputtered deposition.

6. The assembly of claim 1, wherein the substrate is configured as an electronic device.

7. The assembly of claim 1, wherein the deposition of the material upon the surface of the substrate is configured as a chemical vapor deposition or photolithography.

8. The assembly of claim 1, wherein the surface of the substrate further comprises one or more surface portions of differing elevation, wherein the plurality of island mask features mask the one or more surface portions of differing elevation.

9. The assembly of claim 1, wherein the surface of the substrate is a nonplanar surface, wherein the frame conforms to the nonplanar surface.

10. The assembly of claim 9, wherein the plurality of island mask features block the deposition of the material to at least a portion of the nonplanar surface.

11. The assembly of claim 1, further comprising non-island mask features.

12. The assembly of claim 9, wherein the non-island mask features are etched through a mask layer blocking the portion of the surface of the substrate.

13. The assembly of claim 1, the shadow mask comprising a second plurality of posts, wherein the second plurality of posts comprise a first end coupled to the frame, wherein the second plurality of posts comprise a second end coupled to the plurality of crossbeams, wherein the second plurality of posts elevate the plurality of crossbeams relative to the frame.

14. The assembly of claim 1, wherein the substrate is circular, wherein the frame is circular.

\* \* \* \* \*